United States Patent
Chou et al.

(10) Patent No.: US 7,592,044 B2
(45) Date of Patent: Sep. 22, 2009

(54) METHOD FOR MANUFACTURING PATTERNED LAYER ON SUBSTRATE

(75) Inventors: Ching-Yu Chou, Hsinchu (TW);
Yu-Ning Wang, Hsinchu (TW);
Jih-Jenn Huang, Hsinchu (TW);
Yi-Ming Liao, Hsinchu (TW)

(73) Assignee: ICF Technology Limited, Santa Clara ( * ) Notice: Subject to any disclaimer, the term of this patent is extended or adjusted under 35 U.S.C. 154(b) by 0 days.

(21) Appl. No.: 11/964,543

(22) Filed: Dec. 26, 2007

(65) Prior Publication Data

US 2008/0259106 A1 Oct. 23, 2008

(30) Foreign Application Priority Data

Apr. 20, 2007 (TW) ............... 96113931 A

(51) Int. Cl.
*B05D 5/00* (2006.01)
(52) U.S. Cl. ............... 427/256; 427/58; 427/64; 427/68; 427/286; 347/5; 347/12; 347/20
(58) Field of Classification Search ............ 427/58, 427/64, 68, 286, 256
See application file for complete search history.

(56) References Cited

U.S. PATENT DOCUMENTS

2002/0140780 A1* 10/2002 Igaki et al. ............... 347/68

2006/0017757 A1* 1/2006 Goto ............... 347/9

FOREIGN PATENT DOCUMENTS

| CN | 1358626 | 7/2002 |
| CN | 1739970 | 3/2006 |
| WO | WO 2006/123167 A1 * | 11/2006 |

* cited by examiner

*Primary Examiner*—Shamim Ahmed
(74) *Attorney, Agent, or Firm*—Frank R. Niranjan

(57) ABSTRACT

A method for manufacturing a patterned layer (106) on a substrate (100) includes the following steps: providing a substrate having a plurality of banks (102) formed thereon, the substrate and the banks cooperatively defining a plurality of accommodating spaces (104), wherein each of the accommodating spaces has a first edge (110) and a second edge (112) parallel to the first edge, a distance between the first edge and the second edge is b; the first nozzle (302) moving along a first path (306), and the first path is parallel to the first edge, a distance between the first path and the first edge is a; the first nozzle jetting ink into the accommodating space; the second nozzle (304) moving along a second path (310), a distance between the first path and the second path is c, and the distance c satisfies one of the two equations: 0<c<b−a, and 0<c<a.

9 Claims, 16 Drawing Sheets

METHOD FOR MANUFACTURING PATTERNED LAYER ON SUBSTRATE

CROSS-REFERENCE TO RELATED APPLICATIONS

This application claims all benefits accruing under 35 U.S.C. §119 from Taiwan Patent Application No. 96113931, filed on Apr. 20, 2007 in the Taiwan Intellectual Property Office, the disclosure of which is incorporated herein by reference.

BACKGROUND

1. Technical Field

The present invention relates to a method for manufacturing a patterned layer on a substrate.

2. Description of the Related Art

At present, methods for manufacturing a patterned layer on a substrate include a photolithographic method and an ink-jet method.

The photolithographic method is described as below: applying a photoresist layer on a substrate; exposing the photoresist layer using a photo mask with a predetermined pattern and developing the exposed photoresist layer to form a predetermined patterned thin-film layer. Thus a large part of the photoresist material is wasted and the efficiency is low. This increases the cost.

The ink-jet method uses an ink-jet device with at least one print head for depositing ink into a predetermined position on a substrate structure. A patterned layer is formed after solidifying the ink. Generally, for an area of the substrate structure is larger than a covering area of the print head, the print head of the ink-jet device move relatively in a matrix manner with the substrate to finish depositing the ink on the substrate.

The ink jet method is different from the photolithographic method. In the ink jet method, each of R, G, and B ink is sprayed onto a substrate from respective nozzles of print heads to form a color layer. When the ink jet method is employed, the required amount of ink can be applied onto a required place at a specific time. Accordingly, almost no ink is wasted. Furthermore, since the sub-cells of R, G, and B can be formed simultaneously, the coloring time is reduced, and it is possible to markedly reduce cost.

Referring to FIG. 14 and FIG. 15, a substrate 120 is shown. A plurality of banks 122 are formed on the substrate 120. The plurality of banks 122 and the substrate 120 cooperatively define a plurality of accommodating spaces 124 therein, and the accommodating spaces 124 are arranged in rows and columns on the substrate 120. To more thoroughly describe the structure of the accommodating spaces 124 arranged on the substrate 120, an x-axis runs horizontally and a y-axis runs vertically as shown in FIG. 14. Rows of the accommodating spaces 124 are arranged in the direction along the x-axis. Columns of the accommodating spaces 124 are arranged in the direction along the y-axis. A distance between every two adjacent rows of the accommodating spaces 124 is d.

Referring to FIG. 16, a print head 900 includes a plurality of nozzles 902, 904. A distance between the nozzle 902 and the nozzle 904 is d. Firstly, the nozzle 902 moves along a first path 312 in the positive direction along the x-axis (moving to right hand side seen in the drawing), when ink is discharged toward the substrate 122 from the first nozzle 902. Secondly, the print head 900 moves in the negative direction along the y-axis (moving downward seen in the drawing). The moving distance of the print head 900 is d. Finally, the print head 900 moves in the negative direction along the x-axis (moving to left hand side seen in the drawing). However, when the nozzle 904 repeats the same moving line of the nozzle 902, the ink is discharged from the nozzle 904 and overlapped with the ink discharged from the nozzle 902 in previous printing in the same accommodating space. Since the inks is always discharged in the same printing line in the same accommodating space 124, it is difficult to diffuse uniformly before drying, such that a thickness of the patterned layer on the substrate is not likely to be uniform.

What is needed, therefore, is a method for manufacturing a patterned layer on a substrate with a uniform thickness.

SUMMARY

A method for manufacturing a patterned layer on a substrate includes the following steps. 1). A substrate having a plurality of banks formed thereon is provided. The substrate and the banks cooperatively define a plurality of accommodating spaces, wherein each of the accommodating spaces has a first edge and a second edge parallel to the first edge. 2). A first nozzle is provided. The first nozzle is moved along a first path, wherein the first path is located between the first edge and the second edge of an accommodating space, and the first path is parallel to the first edge. 3). Ink is deposited into the accommodating space from the first nozzle. 4). A second nozzle is provided. The second nozzle is moved along a second path, wherein the second path is parallel to the first path. 5). Ink is deposited into the accommodating space from the second nozzle and the inks are solidified in the accommodating space so as to form a patterned layer. A distance between the first edge and the second edge of the accommodating spaces is b. A distance between the first path and the first edge of the accommodating spaces is a. A distance between the first path and the second path is c, and the distance c satisfies one of the two equations: $0<c<b-a$, and $0<c<a$.

A method for manufacturing a patterned layer on a substrate includes the following steps. 1). A substrate having a plurality of banks formed thereon is provided. The substrate and the banks cooperatively define a plurality of accommodating spaces, wherein every accommodating space has a first edge and a second edge parallel to the first edge. 2). A nozzle is provided. The nozzle is moved along a first path, wherein the first path is located between the first edge and the second edge of an accommodating space, and the first path is parallel to the first edge. 3). Ink is deposited into the accommodating space from the nozzle. The nozzle is moved along a second path, wherein the second path is parallel to the first path. 4). Ink is deposited into the accommodating space from the nozzle and the inks in the accommodating space are solidified to form a patterned layer.

BRIEF DESCRIPTION OF THE DRAWINGS

Many aspects of the present print head unit and method for manufacturing a patterned layer on a substrate using the same can be better understood with reference to the following drawings. The components in the drawings are not necessarily drawn to scale, the emphasis instead being placed upon clearly illustrating the principles of the present print head unit and method. Moreover, in the drawings, like reference numerals designate corresponding parts throughout the several views.

Figure 1:
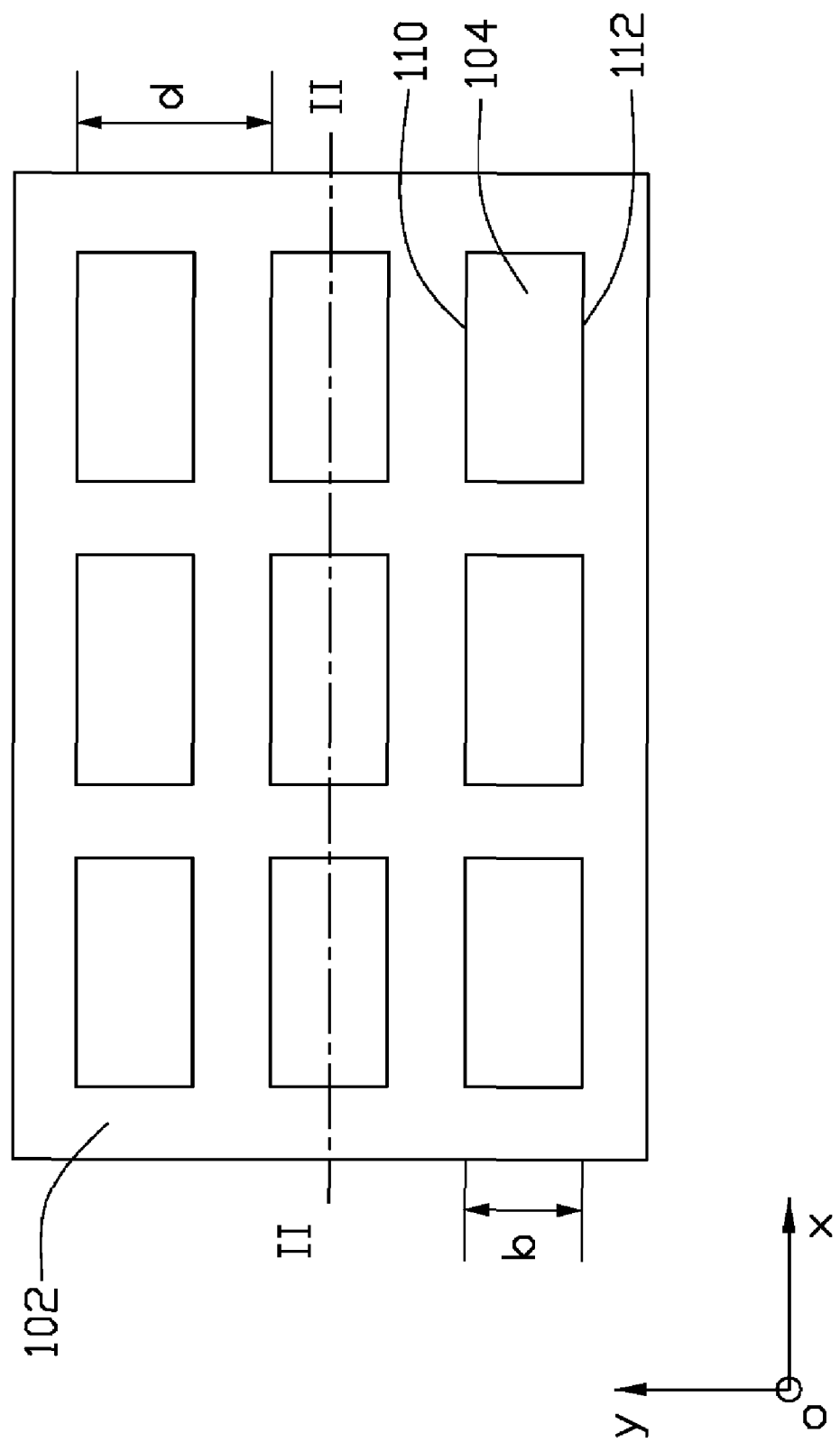
FIG. 1 is a top view of a substrate used in a method for manufacturing a patterned layer thereon in accordance with a first preferred embodiment, wherein a plurality of banks are formed on the substrate, and the substrate and the banks cooperatively define a plurality of accommodating spaces.

Corresponding reference characters indicate corresponding parts throughout the drawings. The exemplifications set out herein illustrate at least one preferred embodiment of the present method, in one form, and such exemplifications are not to be construed as limiting the scope of the invention in any manner.

DETAILED DESCRIPTION OF THE INVENTION

The preferred embodiments of the present invention will now be described with reference to the attached drawings.

With reference to FIGS. 1 to 10, a method for manufacturing a patterned layer on a substrate in accordance with a first present embodiment is illustrated. The method mainly includes the following steps.

Figure 2:
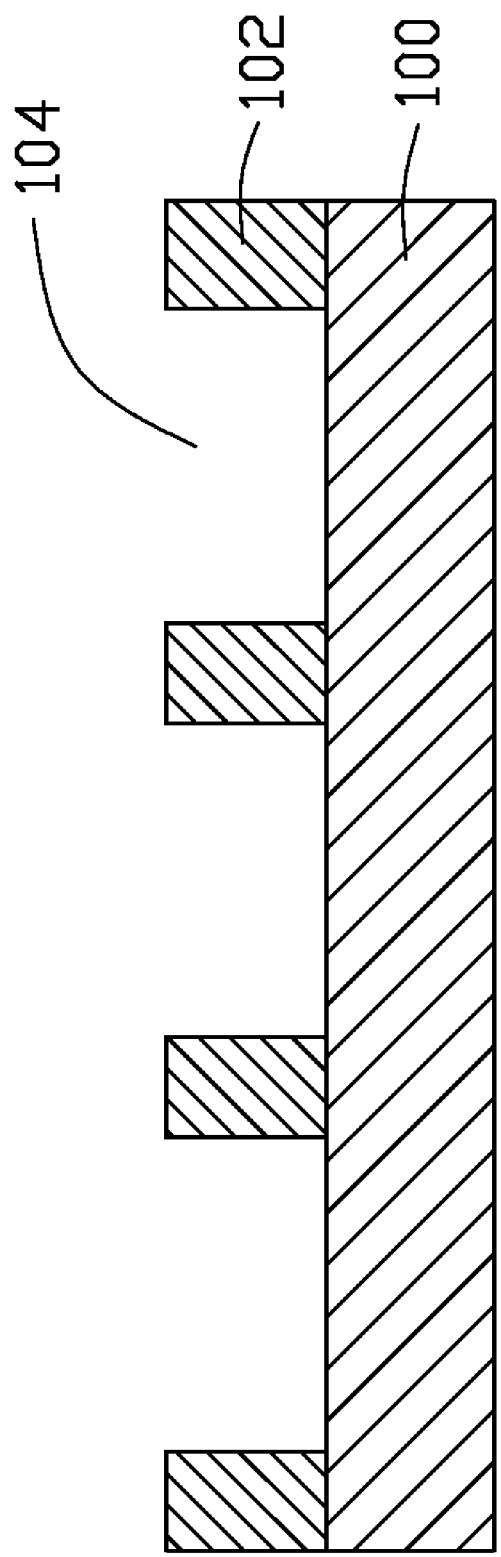
FIG. 2 is a cross-sectional view taken along line II-II of FIG. 1.

In step 1, referring to FIG. 1 and FIG. 2, a substrate 100 is provided. A plurality of banks 102 is formed on the substrate 100. The substrate 100 and the plurality of banks 102 cooperatively define a plurality of accommodating spaces 104. The accommodating spaces 104 are arranged in rows and columns. The rows of the accommodating spaces 104 are arranged in the direction along the x-axis. The columns of the accommodating spaces 104 are arranged in the direction along the y-axis. In the present embodiment, a distance between every two adjacent rows of the accommodating spaces 104 is defined as d. That is, a pitch between every two adjacent rows of the accommodating spaces 104 is d. Every accommodating space 104 has a first edge 110 and a second edge 112. The second edge 112 is parallel to the first edge 110. A distance between the first edge 110 and the second edge 112 is b, i.e., the width of the accommodating space 104 is b. A material of the substrate 100 is selected from the group consisting of glass, quartz glass, silicon, metal and plastic. In the present embodiment, the substrate 100 is a glass substrate.

Figure 3:
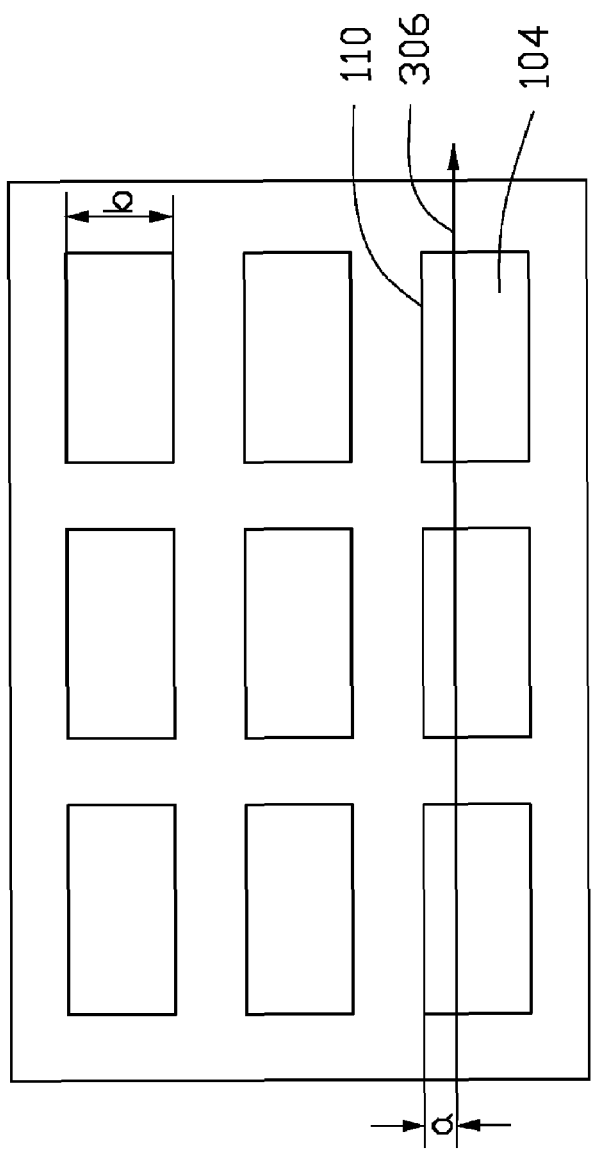
FIGS. 3 to 6 illustrate an ink jetting process of the method in accordance with a first preferred embodiment.

In step 2, referring to FIG. 3, a print head 300 is provided. The print head 300 includes a plurality of nozzles. In the present embodiment, the print head 300 includes a first nozzle 302 and a second nozzle 304. The first nozzle 302 and the second nozzle 304 are arranged parallel to the y-axis. The nozzle pitch in the direction along the y-axis between the first nozzle 302 and the second nozzle 304 is d. The print head 300 moves along a first path 306. The first path 306 is located between the first edge 110 and the second edge 112 of the accommodating space 104. The first path 306 is parallel to the first edge 110. A distance between the first path 306 and the first edge 110 is a. The first nozzle 302 discharges ink into the accommodating space 104 when it moves right above the accommodating space 104. The print head 300 can be either a thermal bubble print head or a piezoelectrical print head.

Figure 4:
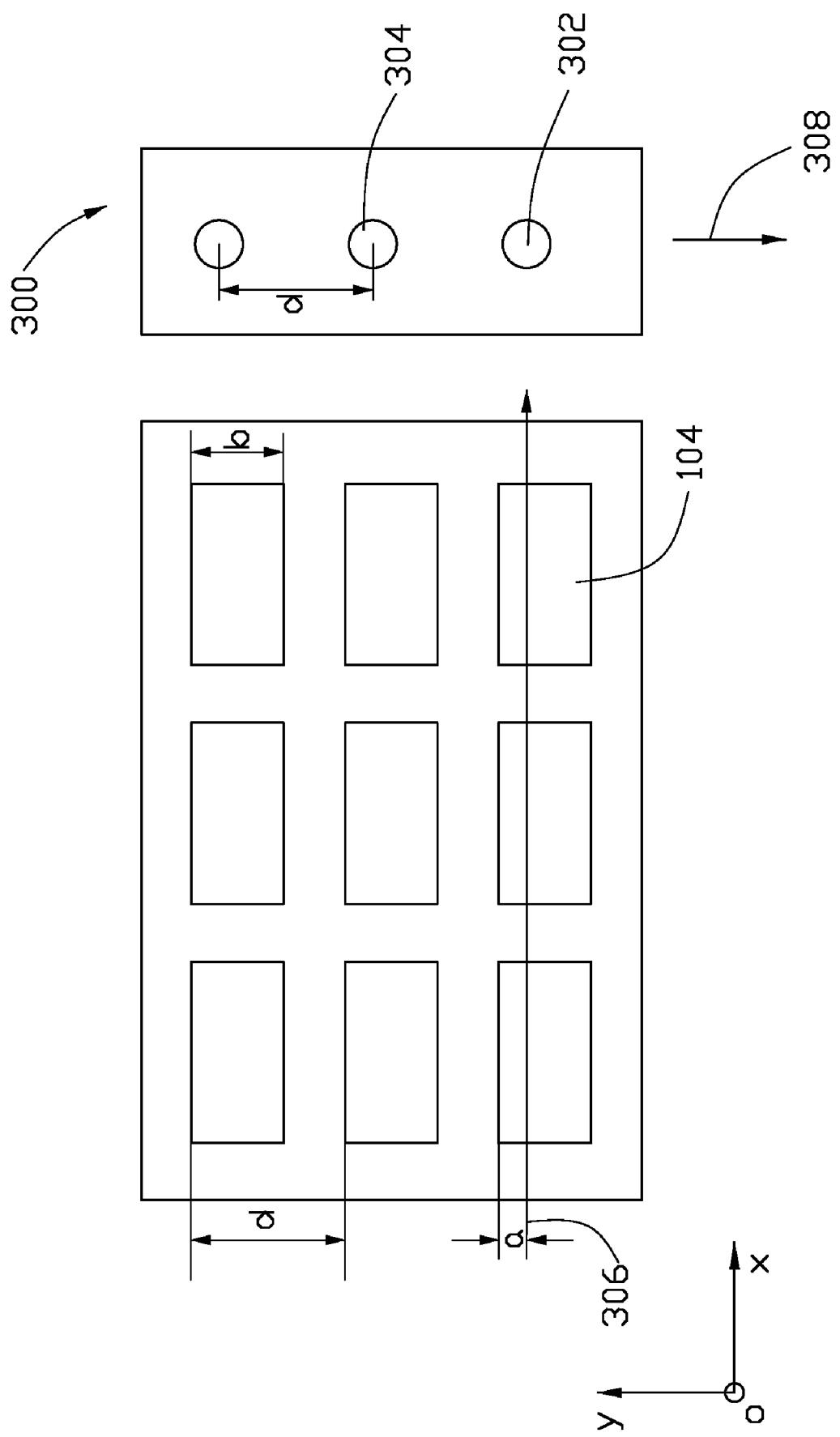
Figure 5:
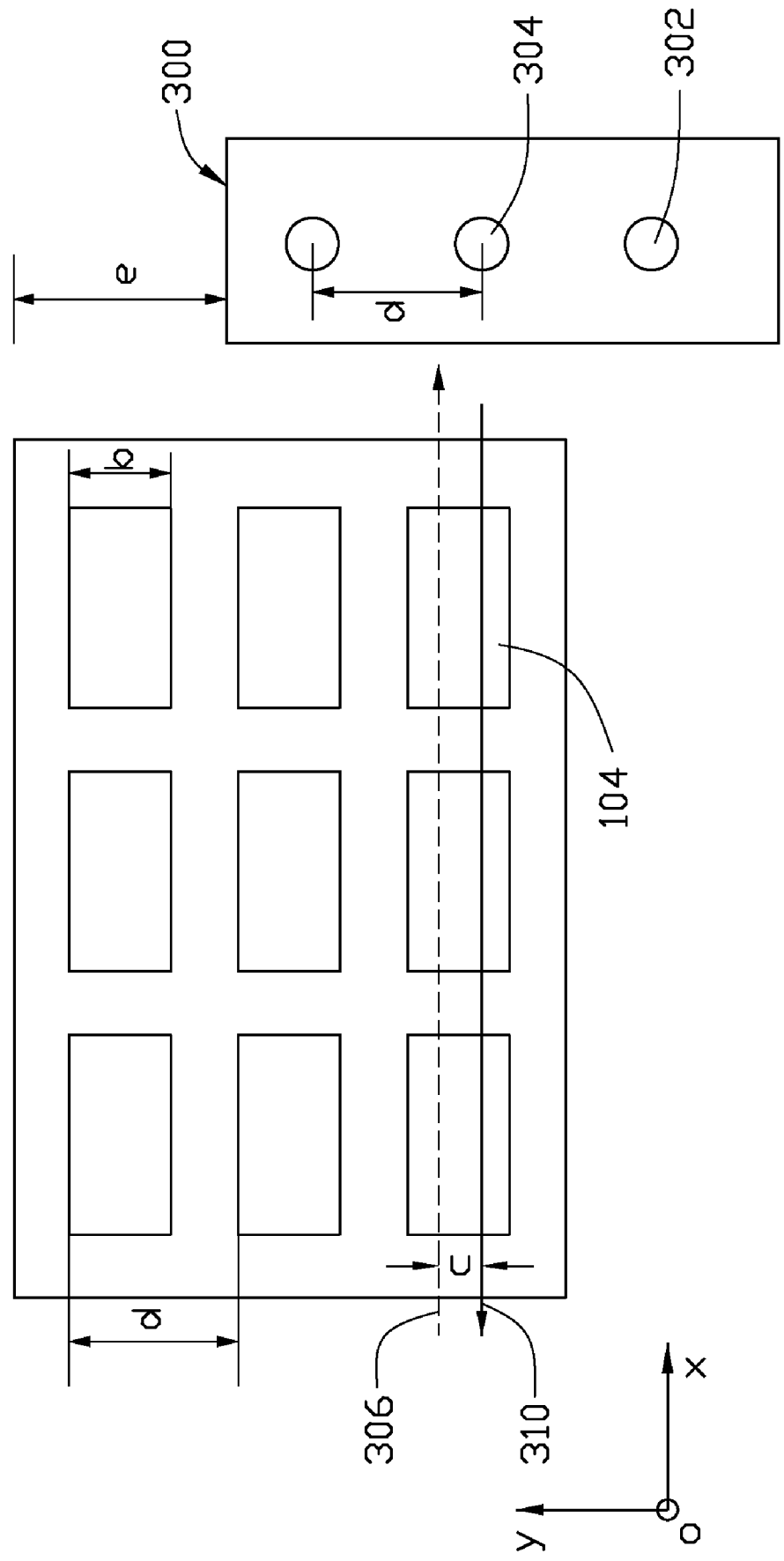

In step 3, with reference to FIGS. 4 and 5, when the print head 300 moves to the other side of the accommodating space 104, the print head 300 does not keep moving in the x-axis direction, but moves along a third path 308 parallel to the y-axis, in the negative direction along the y-axis. The moving distance along the third path 308 of the print head 300 is e. The distance e satisfies one of the two equations: d<e<d+b−a, and d−a<e<d. It can be understood that, the nozzle pitch in the y-axis direction between the first nozzle 302 and the second nozzle 304 can be k multiply d (k·d), wherein k is a natural number. Accordingly, the distance e satisfies one of the two equations: kd<e<kd+b−a, and kd−a<e<kd (k is a natural number).

Figure 6:
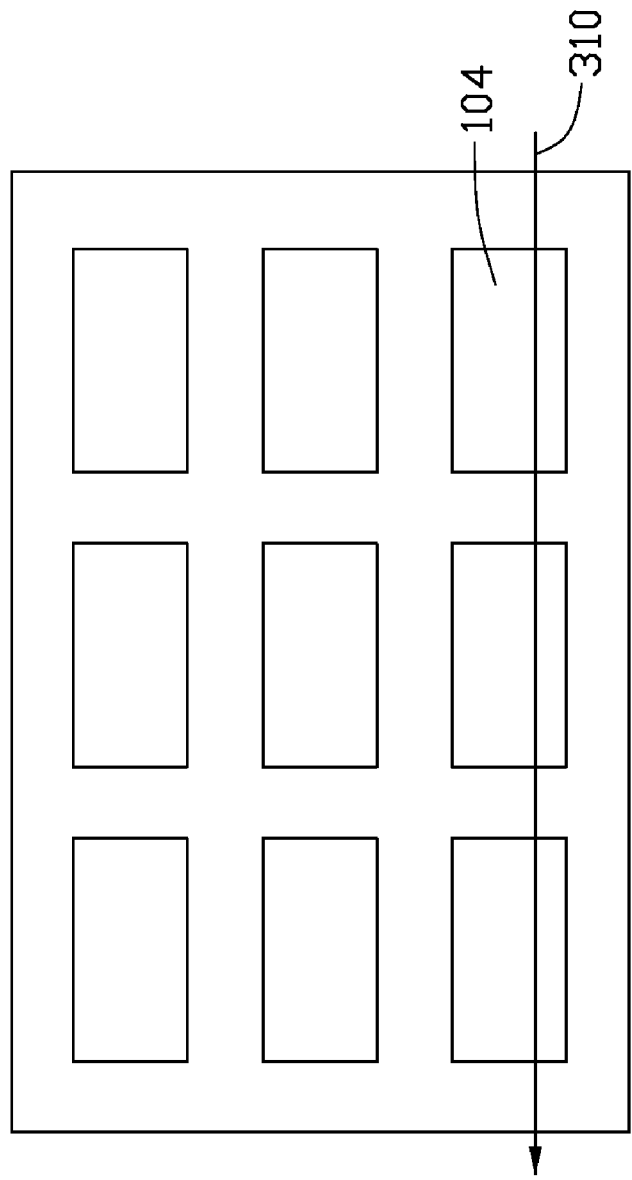
Figure 6:
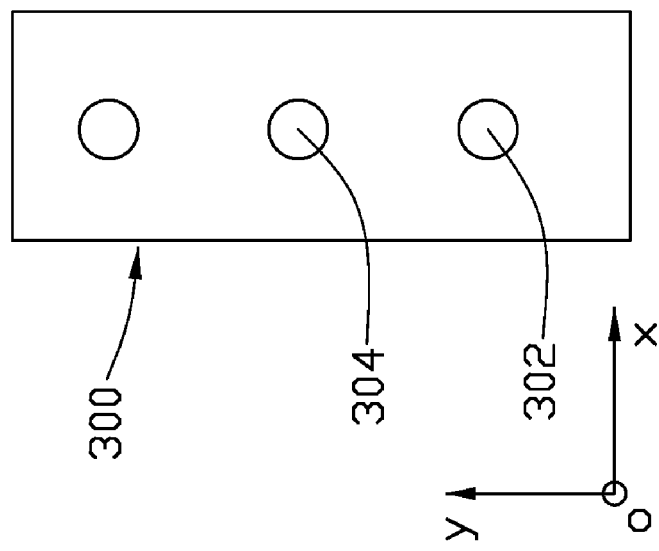

Referring to FIGS. 5 and 6, in step 4, the print head 300 moves along a second path 310 in the negative direction along the x-axis. The second path 310 is located between the first edge 110 and the second edge 112 of the accommodating space 104. The second path 310 is parallel to the first path 306. The second nozzle 304 discharges ink into the accommodating space 104 when it moves right above the accommodating space 104. When the moving distance e of the print head 300 satisfies the equation: d<e<d+b−a, the distance c (c=e−d) between the first path 306 and the second path 310 satisfies the equation: 0<c<b−a; and when the moving distance e satisfies the equation: d−a<e<d, the distance c between the first path 306 and the second path 310 satisfies the equation: 0<c<a.

The ink includes at least a solvent. Preferably, the solvent is an organic solvent. The boiling point of the solvent is higher than 170 degrees Centigrade, preferably, higher than 185 degrees Centigrade. Since solvent in the ink has a higher boiling point, the drying speed of the ink is slower. Accordingly, the inks discharged in the accommodating space 104 by the first nozzle 302 and the second nozzle 304 can be thoroughly mixed together before drying.

Figure 7:
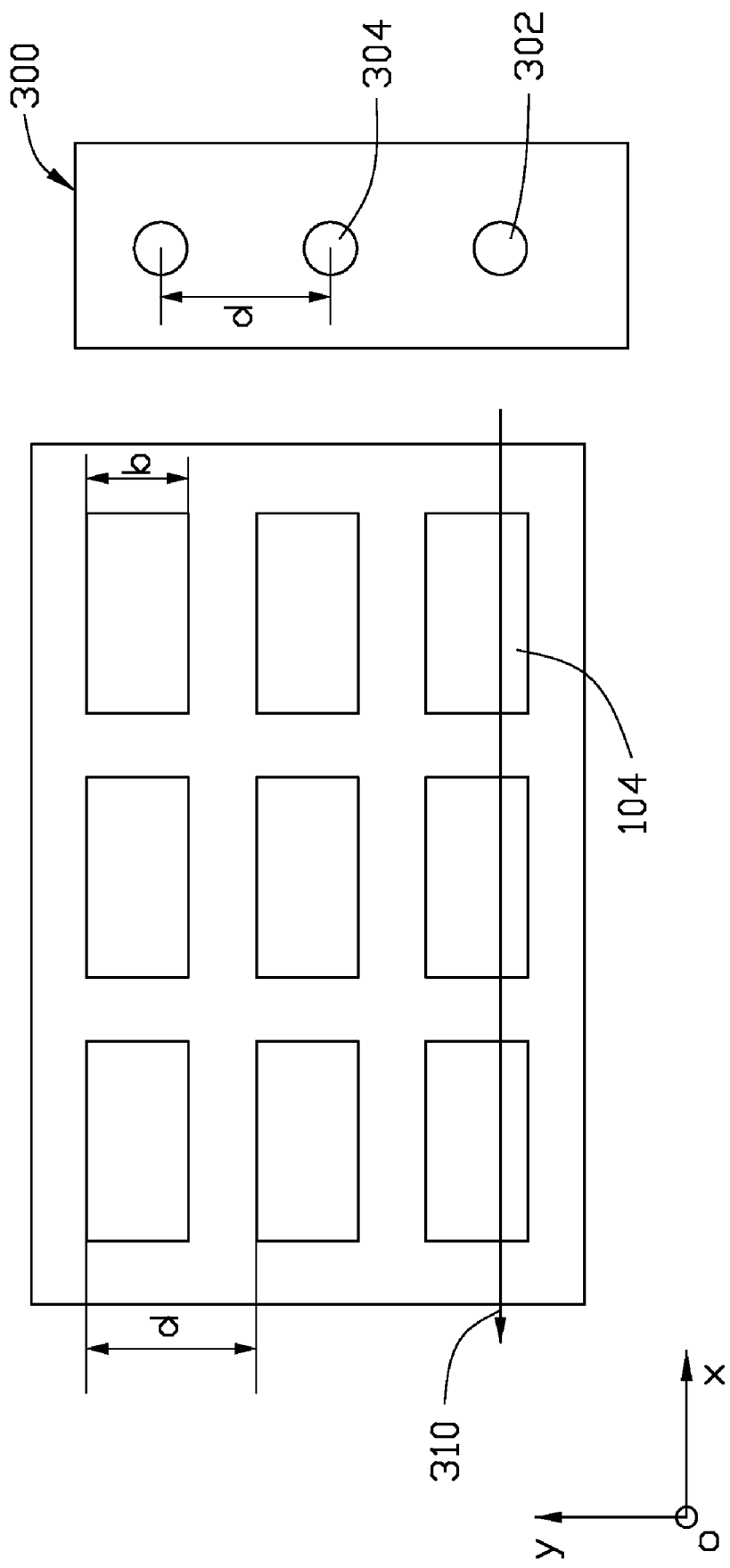
FIGS. 7 to 8 illustrate another ink jetting process of the method in accordance with a first preferred embodiment.
Figure 8:
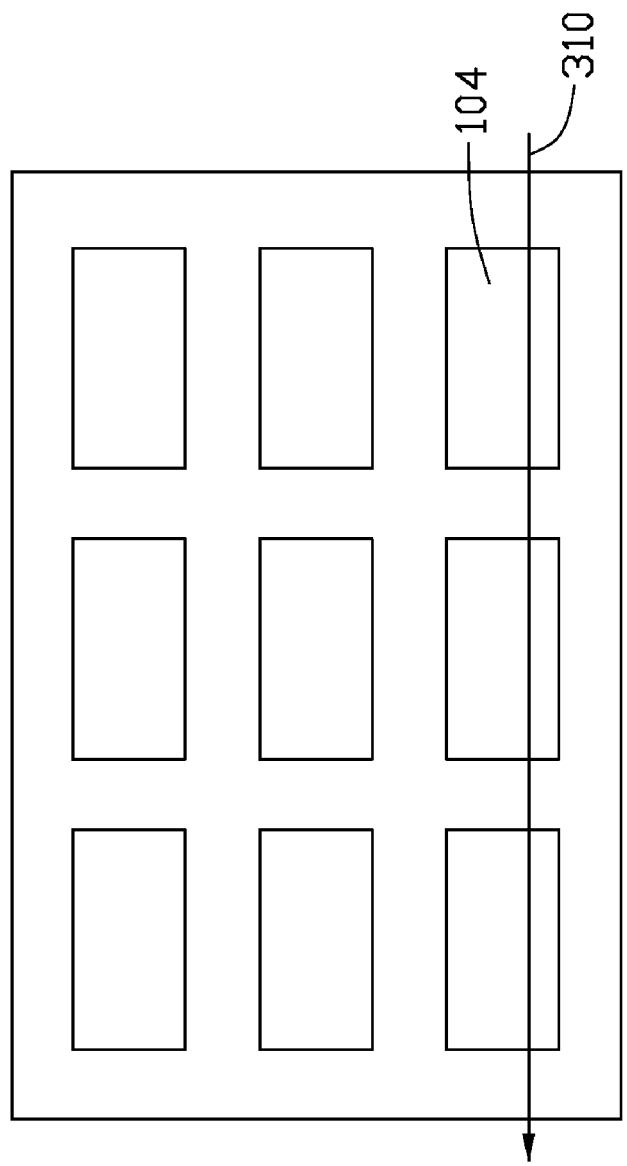
Figure 8:
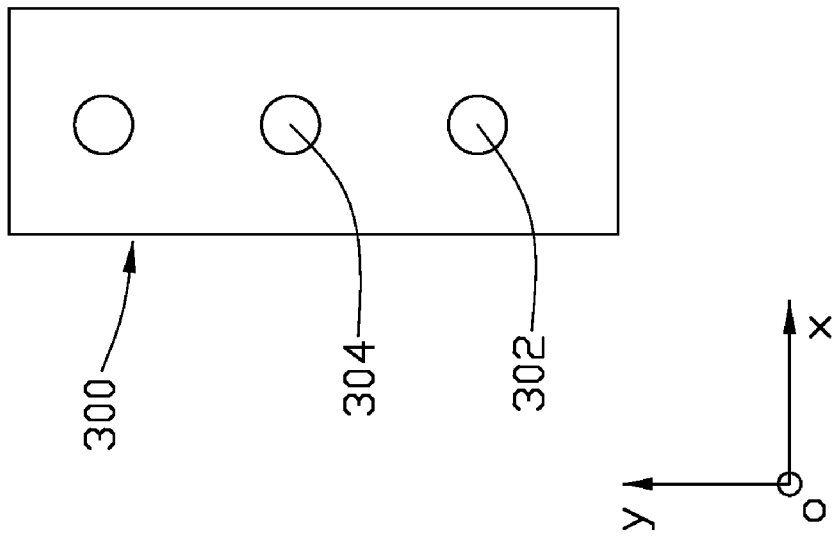

In an alternative embodiment, ink can be discharged from a same nozzle. Referring to FIG. 4 and FIG. 7, when the first nozzle 302 moves right above the second path 310, the print head 300 does not keep moving along the third path 308, but moves along the second path 310 in the negative direction. The first nozzle 302 discharges ink into the accommodating space 104 again when it moves right above the accommodating space 104.

Figure 9:
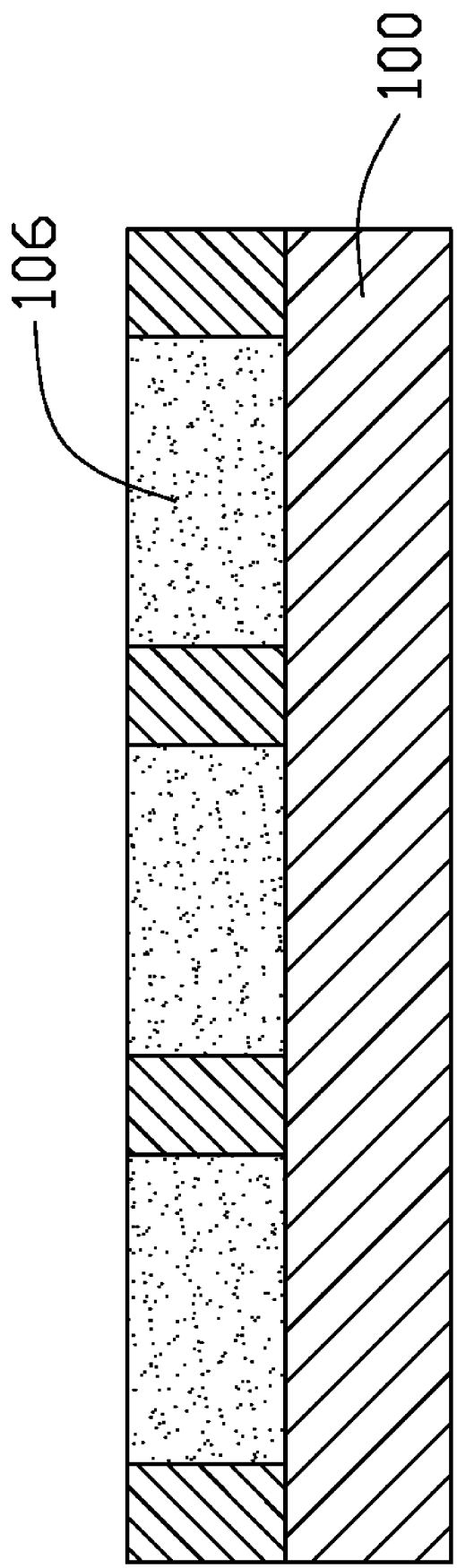
FIG. 9 is a cross-sectional view of the substrate in FIG. 1 with a solidified patterned layer.

Referring to FIG. 9, in step 5, the inks in the accommodating spaces 104 are solidified by a solidifying device (not shown), such as a heating device or an ultraviolet light source. As a result, a patterned layer 106 is formed in the accommodating spaces 104. A heating device and a vacuum-pumping device can also be used for solidifying the ink in the accommodating spaces 104.

It is to be understood that, in alternative embodiments, any suitable nozzle pitch between the first nozzle 302 and the second nozzle 304 may be applied. As long as the distance c between the first path 306 and the second path 310 satisfies one of two equations: 0<c<b−a, and 0<c<a, the ink will be deposited into different positions in the same accommodating space 104. It is to be understood that the ink jet into the same accommodating space can be discharged from a plurality of nozzles moving along at least three different lines.

Since the ink is deposited into the same accommodating space from a plurality of nozzles in different positions, the distribution of the ink in the accommodating space is likely to become more uniform. As a result, the thickness uniformity of the patterned layer on the substrate is enhanced.

Figure 10:
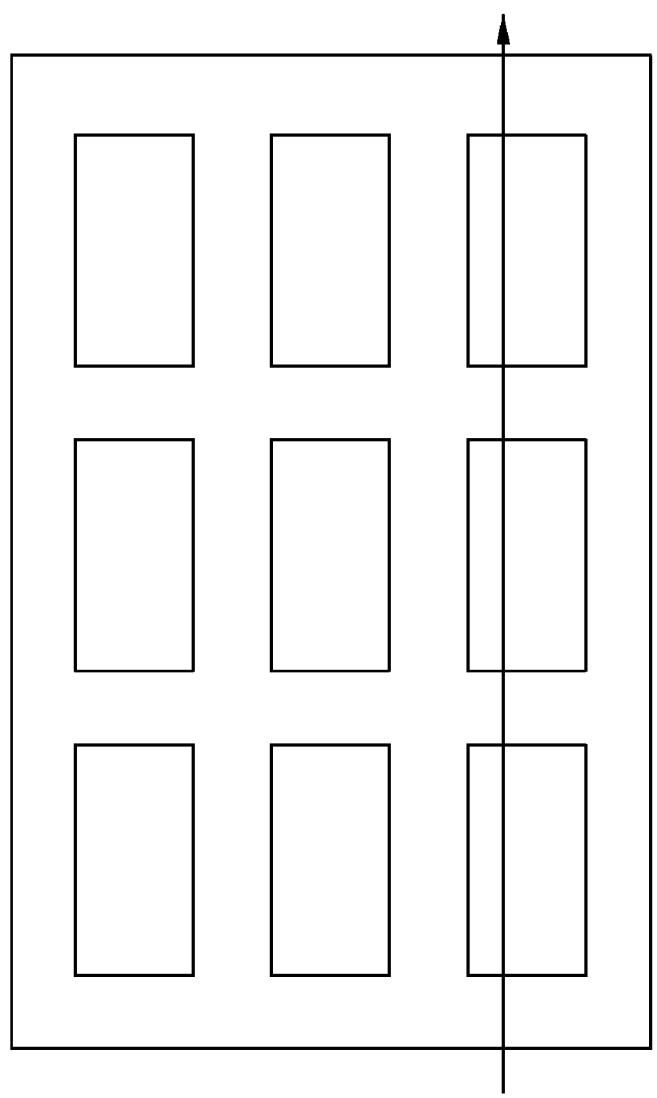
FIG. 10 illustrates an ink jetting process of the method in accordance with a second preferred embodiment.

Referring to FIG. 10, a method for manufacturing a patterned layer on a substrate in accordance with a second embodiment is shown. The method is similar to the method of the first embodiment. The difference is that a first nozzle 402 and a second nozzle 502 are separately provided by a first print head 400 and a second print head 500. The first print head 400 can be different from the second print head 500. The moving paths of the first nozzle 402 and the second nozzle 502 are similar to the moving paths of the first nozzle 302 and the second nozzle 304 in the first embodiment.

Figure 11:
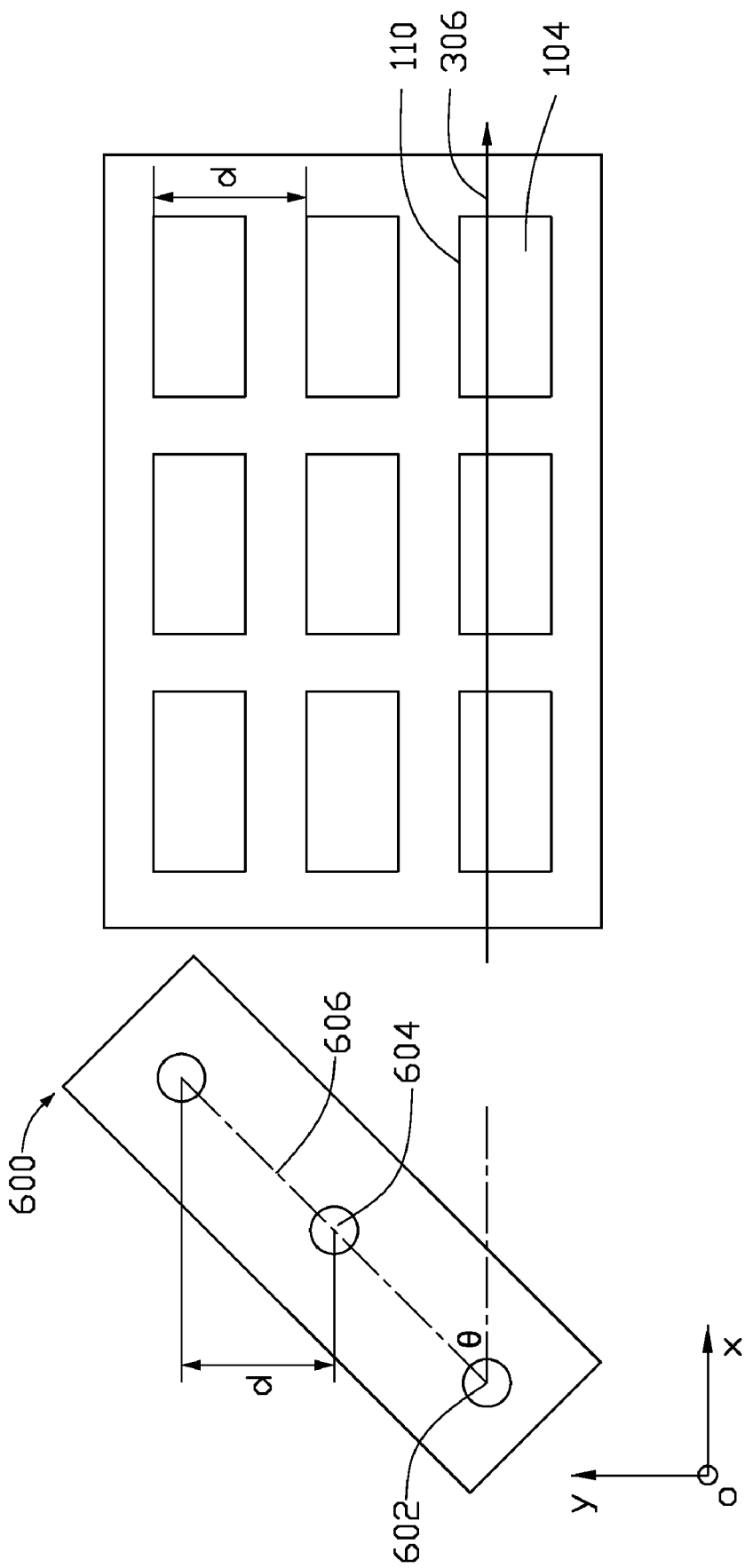
FIG. 11 illustrates an ink jetting process of the method in accordance with a third preferred embodiment.

Referring to FIG. 11, a method for manufacturing a patterned layer on a substrate in accordance with a third embodiment is shown. The method is similar to the method of the first embodiment. The difference is that a first nozzle 602 and a second nozzle 604 included in a print head 600 are spaced from one another along a line that is parallel to the substrate, and the line is called a nozzle line 606. The nozzle line 606 is slanted relative the first path 306. The angle between the nozzle line 606 and the first path 306 is θ, wherein 0°<θ<90°. In the present embodiment, θ equals 45°. The projection distance on the y-axis between the first nozzle 602 and the second nozzle 604 is d.

Figure 12:
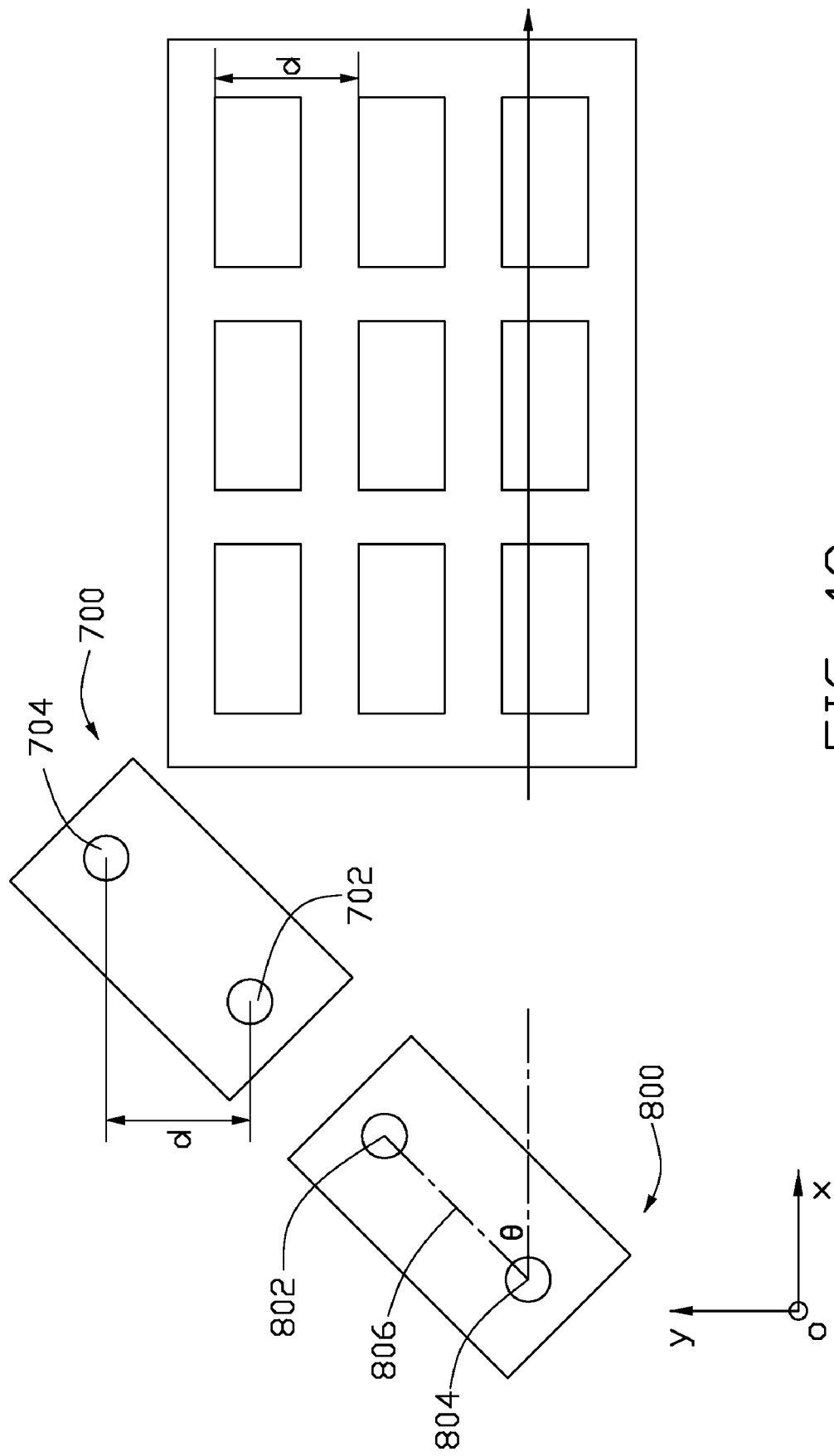
FIG. 12 illustrates an ink jetting process of the method in accordance with a forth preferred embodiment.

Referring to FIG. 12, a method for manufacturing a patterned layer on a substrate in accordance with a fourth embodiment is shown. The method is similar to the method of the second embodiment. The difference is that nozzles 702, 704 included in a print head 700 and nozzles 802, 804 included in a print head 800 are spaced from one another along a line that is parallel to the substrate, and the line is called a nozzle line 806. The angle between the nozzle line 806 and the first path 306 is θ, wherein 0°<θ<90°, 90°<θ<180°. In the present embodiment, θ equals 45°. The projection distance on the y-axis between the nozzle 702 and the nozzle 704 is d.

Figure 13:
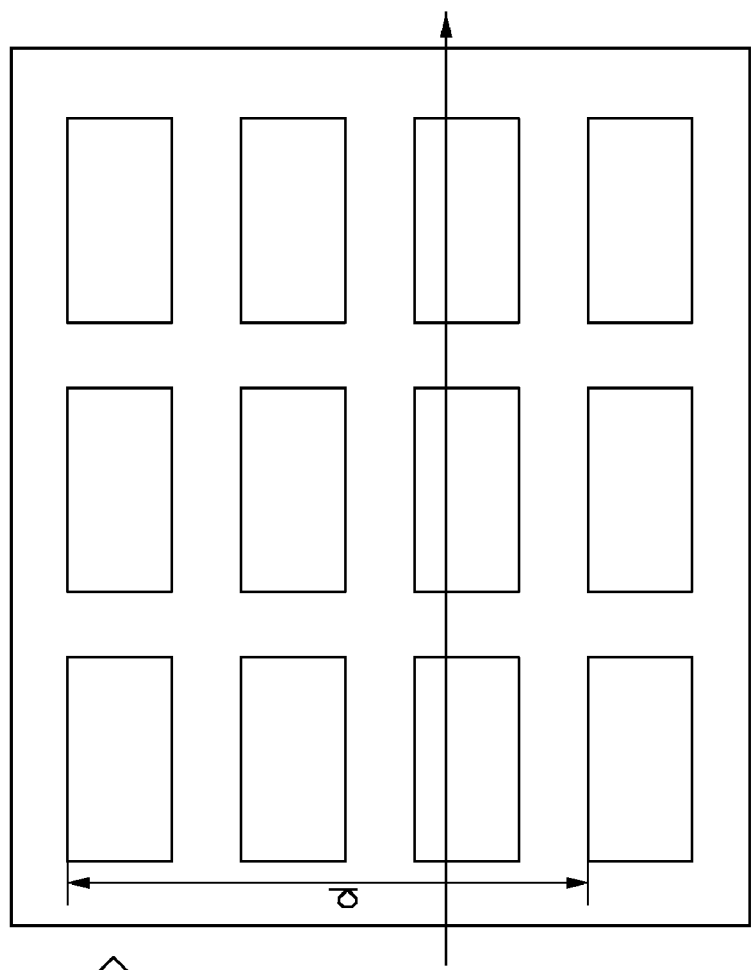
FIG. 13 illustrates an ink jetting process of the method in accordance with a fifth preferred embodiment.
Figure 13:
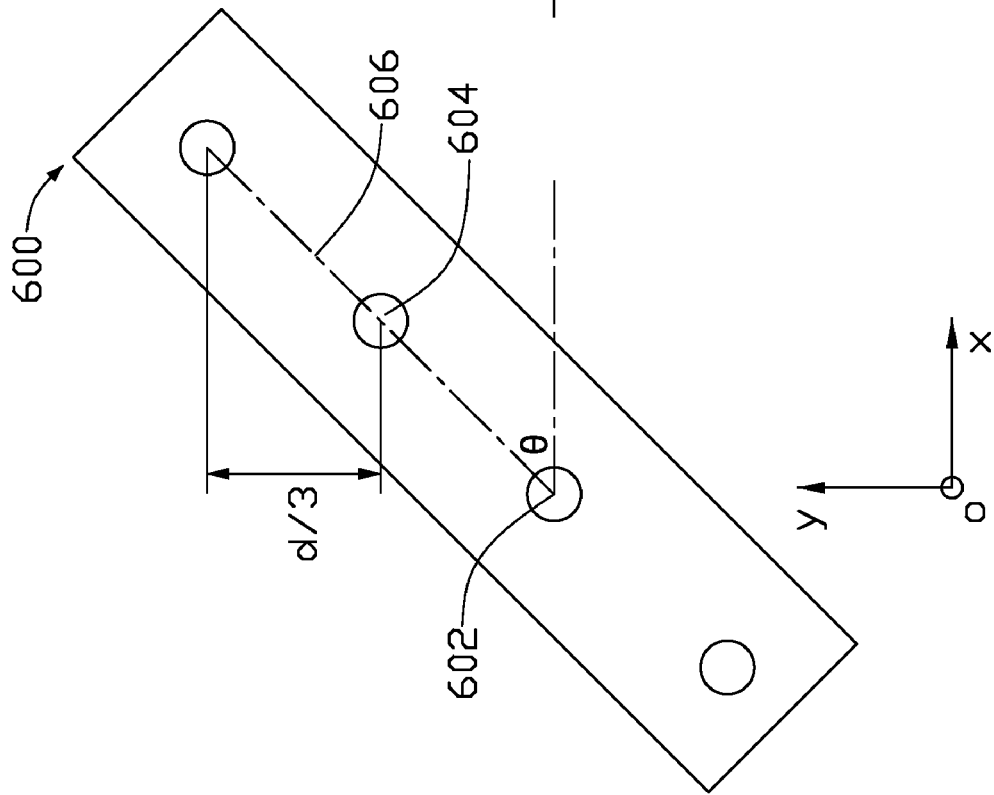
Figure 14:
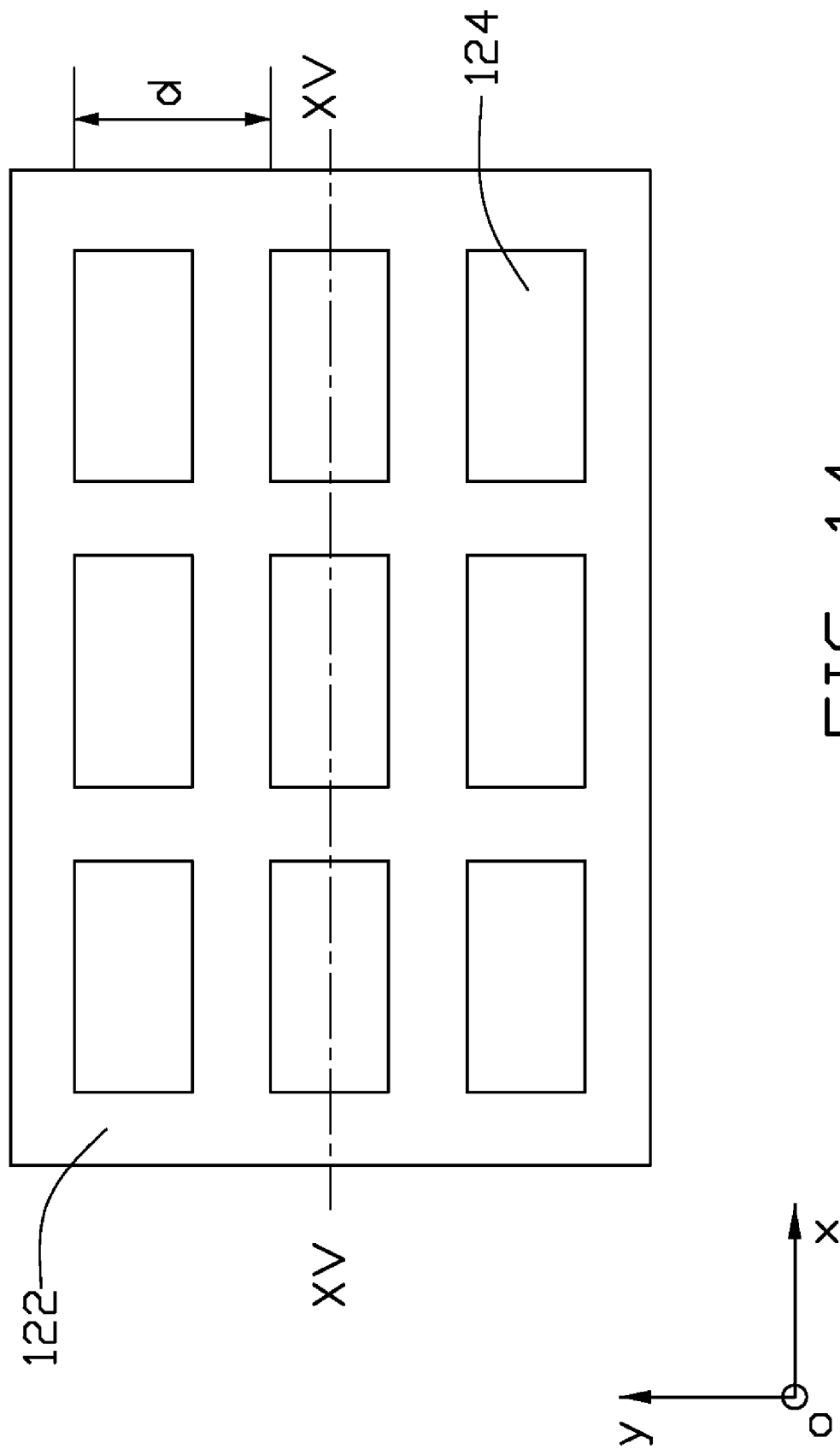
FIG. 14 is a top view of a conventional substrate.
Figure 15:
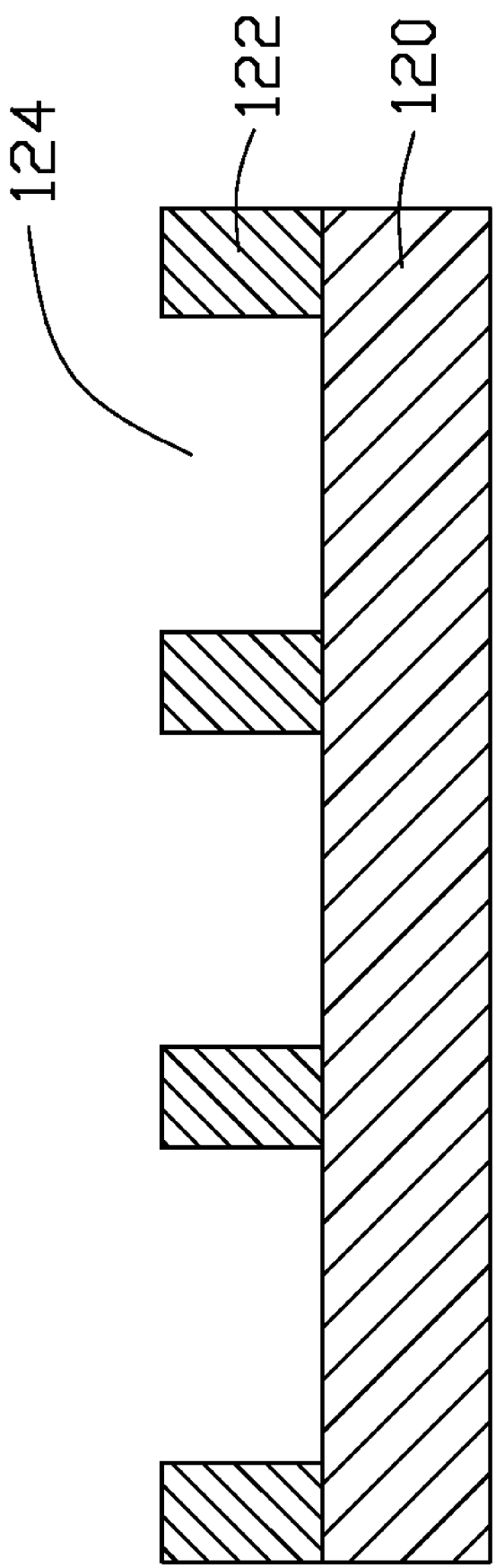
FIG. 15 is a cross-sectional view taken along line XV-XV of FIG. 14.
Figure 16:
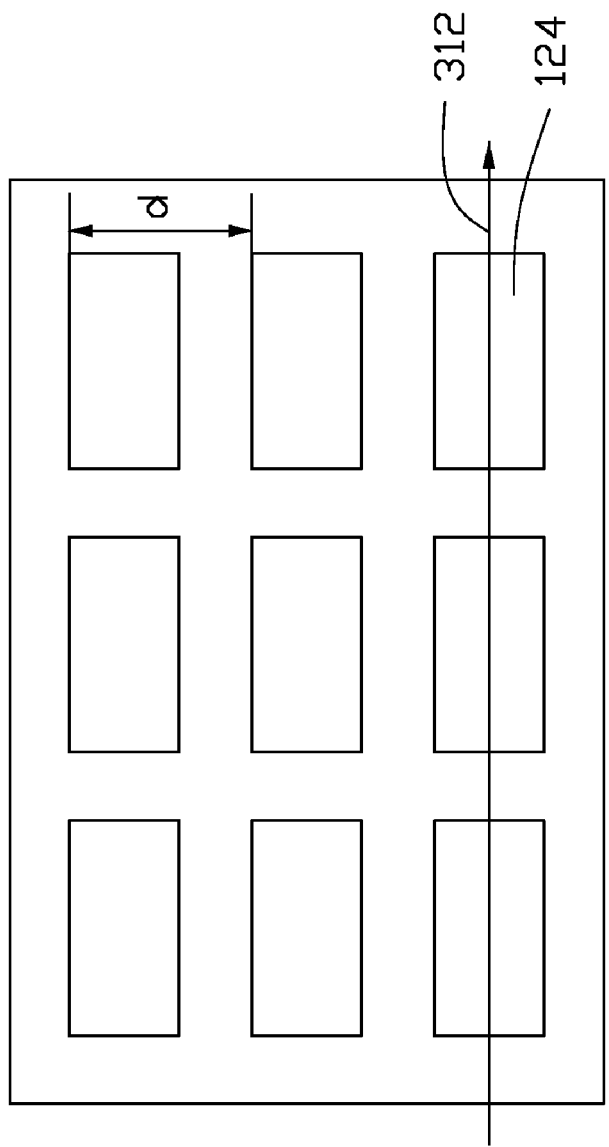
FIG. 16 illustrates a conventional ink jetting process.

Referring to FIG. 13, a method for manufacturing a patterned layer on a substrate in accordance with a fifth embodiment is shown. The method is similar to the method of the third embodiment. The difference is that three different materials are put in successive adjacent rows. Therefore, every fourth row of the accommodating spaces will accommodate the same material. A distance between every fourth row of the accommodating spaces is defined as d. That is, a pitch between every four rows of the accommodating spaces is d. The projection distance on the y-axis between the first nozzle 602 and the second nozzle 604 is d/3.

Note that the above description has been made patterned layer on a substrate, including but not limit to display device panels formed by discharging display material on a substrate like a color filter, EL display devices formed by applying self-illuminating material in recession surrounded by partitions provided upon a substrate.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A method for manufacturing a patterned layer on a substrate using at least one print head, comprising the steps of:
providing a substrate having a plurality of banks formed thereon, the substrate and the banks cooperatively defining a plurality of accommodating spaces, wherein each of the accommodating spaces has a first edge and a second edge parallel to the first edge, and a distance between the first edge and the second edge is "b;"
providing at least one print head comprising a first nozzle and a second nozzle, the first nozzle and the second nozzle being arranged in a nozzle line, the nozzle line being parallel to the substrate;
moving the at least one print head along a first path, wherein the first path is slanted relative to the nozzle line, an angle between the nozzle line and the first path is θ, and θ satisfies 0<θ<90°, and wherein the first path is located between the first edge and the second edge of an accommodating space, the first path is parallel to the first edge, and a distance between the first path and the first edge is "a;"
jetting ink into the accommodating space from the first nozzle during movement of the at least one print head along the first path;
moving the at least one print head along a third path perpendicular to the first path;
moving the second nozzle along a second path, wherein the second path is parallel to the first path, a distance between the first path and the second path is "c," and the distance c satisfies at least one of the two equations: 0<c<b−a, and 0<c<a;
jetting ink into the accommodating space from the second nozzle during movement of the at least one print head along the second path; and
solidifying the inks in the accommodating space so as to form a patterned layer.

2. The method as claimed in claim 1, wherein the ink comprises a solvent, and a boiling point of the solvent is higher than 170 degrees Centigrade.

3. The method as claimed in claim 2, wherein the boiling point of the solvent is higher than 185 degrees Centigrade.

4. The method as claimed in claim 1, wherein a material of the substrate is selected from the group consisting of glass, quartz glass, silicon, metal and plastic.

5. The method as claimed in claim 1, wherein the inks in the accommodating space solidified by a solidifying device, the solidifying device selected from the group consisting of a heating device, a vacuum-pumping device, and an ultraviolet light source.

6. The method as claimed in claim 1, wherein the at least one print head comprises a first print head and a second print head, the first nozzle being arranged on the first print head, and the second nozzle being arranged on the second print head.

7. A method for manufacturing a patterned layer on a substrate using a plurality of print heads, comprising the steps of:
providing a substrate having a plurality of banks formed thereon, the substrate and the banks cooperatively defining a plurality of accommodating spaces, wherein each of the accommodating spaces has a first edge and a second edge parallel to the first edge, and a distance between the first edge and the second edge is "b;"
providing a nozzle;
moving the nozzle along a first path, wherein the first path is located between the first edge and the second edge of an accommodating space, the first path is parallel to the first edge, and a distance between the first path and the first edge is "a;"
jetting ink into the accommodating space from the nozzle during movement of the nozzle along the first path;
moving the nozzle along a third path perpendicular to the first path;

moving the nozzle along a second path, wherein the second path is parallel to the first path, a distance between the first path and the second path is "c," and the distance c satisfies at least one of the two equations: $0<c<b-a$, and $0<c<a$;

jetting ink into the accommodating space from the nozzle during movement of the nozzle along the second path; and solidifying the inks in the accommodating space so as to form a patterned layer.

8. The method as claimed in claim 7, wherein the ink comprises a solvent, and a boiling point of the solvent is higher than 170 degrees Centigrade.

9. The method as claimed in claim 8, wherein the boiling point of the solvent is higher than 185 degrees Centigrade.

* * * * *